United States Patent [19]

Imai

[11] 4,092,487
[45] May 30, 1978

[54] RESIN-SEALED ELECTRICAL DEVICE

[75] Inventor: Takeshi Imai, Obu, Japan

[73] Assignee: Nippondenso Co., Ltd., Kariya, Japan

[21] Appl. No.: 655,953

[22] Filed: Feb. 6, 1976

[30] Foreign Application Priority Data

Feb. 11, 1975 Japan .................................. 50-17175

[51] Int. Cl.² .............................................. H05K 5/06
[52] U.S. Cl. .................................. 174/52 PE; 29/627; 357/72
[58] Field of Search ........................ 317/101 R, 101 C; 174/52 PE; 29/627; 264/272; 336/96; 357/72

[56] References Cited

U.S. PATENT DOCUMENTS

| 2,636,073 | 4/1953 | Clarke | 174/52 PE |
| 2,882,505 | 4/1959 | Feder | 174/52 PE |
| 3,001,105 | 9/1961 | Fox | 174/52 PE |
| 3,440,589 | 4/1969 | Minks | 174/52 PE |
| 3,824,328 | 7/1974 | Ting et al. | 174/52 PE |

FOREIGN PATENT DOCUMENTS 2,347,049   2/1975   Germany ............................. 29/627

*Primary Examiner*—David Smith, Jr.
*Attorney, Agent, or Firm*—Cushman, Darby & Cushman

[57] ABSTRACT

Electrical elements for a voltage regulator are put on a printed-circuit board and disposed in an aluminum case. The electrical elements on the printed-circuit board are coated with a resilient material, with a sealing material which is composed of a resin of a low viscous and a minute granular insulating material being filled in the case, whereby the resin-sealed electrical device becomes much resistive against severe environmental changes.

12 Claims, 9 Drawing Figures

RESIN-SEALED ELECTRICAL DEVICE

BACKGROUND OF THE INVENTION

(1) Field of the Invention

The present invention relates to a resin-sealed electrical device such as an IC voltage regulator, a speed warning device for an automotive vehicle or the like, which are disposed in cases and molded with resin in order to ensure water-proof tightness, resistive strength for wide temperature variations and the like.

(2) Description of Prior Art

A conventional electrical device of this kind is disposed in a case and sealed or molded with highly flexible resin such as epoxy resin, urethane resin or the like in order to protect the electrical device from the severe environmental conditions, especially from vibrations, moisture and vapor, and heating and cooling cycles. However, when the more flexible resin is arranged to be to increase its resistivity for the above-mentioned environmental conditions at lower temperature, the less resistive it becomes at higher temperature, and vi'ce ver'sa.

In order to overcome the above drawback, however, mixture of the flexible resin and granular-inorganic-insulating material has been conventionally used to seal or enclose electrical devices so that the coefficient of thermal expansion may be minimized. However, the above granular-insulating material with the resin mixed together is comparatively high in the viscosity, thus not enough to diffuse everywhere in the electrical device, resulting in another disadvantage that the electrical device can not completely be covered and sealed with the mixture.

Further, electrical devices formed on the board may be broken by wide change of temperature, since the coefficient of thermal expansion of the resin directly stuck thereon is different from that of the printed-circuit board.

SUMMARY OF THE INVENTION

It is, therefore, an object of the present invention to overcome the above drawbacks and to provide a resin-sealed electrical device which is much resistive against severe environmental changes, such as wide change of temperature, vibration, humidity or the like.

It is another object of the present invention to provide a resin-sealed electrical device of high productivity.

It is a further object of the present invention to provide a resin-sealed electrical device, by forming a buffer layer at an upper portion thereof.

Other objects and advantages of the present invention will become apparent when read in connection with the attached drawings.

DETAILED DESCRIPTION OF THE PREFERRED EMBODIMENTS

Figure 1:
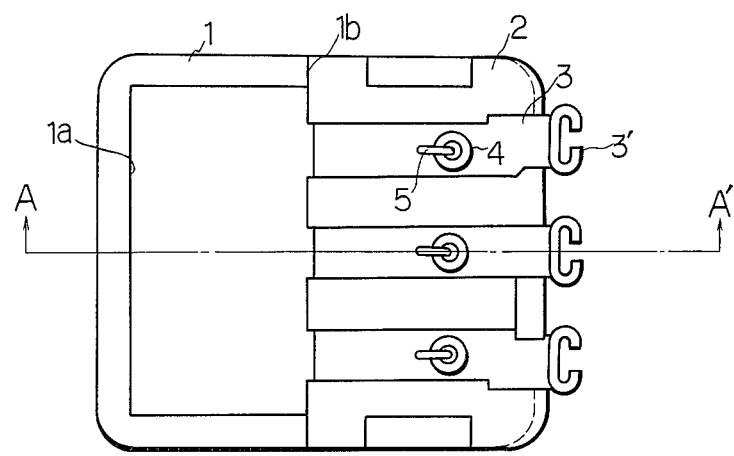
FIGS. 1 and 2 are, respectively, a top view and a sectional view taken along a line A—A' in FIG. 1 showing a first embodiment of the present invention.
Figure 2:
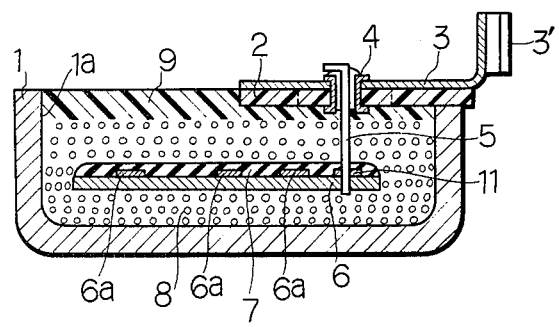

In FIGS. 1 and 2, a case 1 made of aluminum has an open end 1a. A printed-circuit board 6 is disposed in the case 1, on which electrical elements 6a are fixed by soldering to form an electric circuit such as a voltage regulator. The elements 6a are coated with a resilient material 7 such as silicon resin for protecting them from a sealing resin sticking directly thereto. A supporting plate 2 is fixed to the open end 1a of the case 1 fitted into grooves 1b provided thereon, on which terminal stays 3 are fitted by adhesion. Pipe rivets 4 are rivetted to the supporting plate 2 passing through the terminal stays 3. Lead wires 5 pass through the pipe rivets 4 to be fixed thereto by soldering at their one ends and connected to the printed-circuit board 6 at the other ends. Terminals 3' are integrally formed with the terminal stays 3 to be connected, with separate electrical parts. As a packing material 8 minute granular insulating material is filled, with a low viscous resin 9 being impregnated to bind it in the case 1. The above construction can be attained by the following steps:

- disposing the printed-circuit board 6 coated with the resilient material 7 in the case 1:
- pouring the low viscous fluid resin 9 into the case 1 until the half of the case 1 is almost filled therewith;
- heating the low viscous fluid resin at 60°~100° C for 5~7 minutes to further decrease the viscosity of the resin:
- charging the minute granular insulating material 8 into the case 1: and
- heating to harden the low viscous resin at 80°~120° C for 3 or 4 hours, to thereby complete the resin-sealed electrical device shown in FIG. 2.

In FIG. 2, an insulating resin layer 9 is formed at an outer upper surface enclosed by the open end 1a of the case 1, since the density of the packing material 8 is greater than that of the low viscous resin 9 so that the granular insulating material 8 is deposited at the bottom of the case 1. Therefore, only the resin is formed as a layer at the upper portion of the case 1 and the other resin is, of course, impregnated with spaces between the granular insulating material 8, whereby the electrical device including the board 6 and elements 6a is sealed by the insulating resin.

It should be, however, noted in the above steps that the step for charging the granular insulating material 8 into the case 1 can be carried prior to the step for pouring the low viscous resin in fluid into the case, and further noted that the above two steps must be carried independently.

According to the present invention, the breakdown of the electrical elements 6a can be overcome by the resilient material 7 coating them, since the resilient material 7 protect the electrical elements 6a from the insulating material 9 directly sticking thereto, which otherwise, may cause the breakdown of the electrical elements 6a on account of heating and cooling cycles. And further it is advantageous according to the present invention in that the productivity can be increased by independently carrying the steps of pouring the low viscous resin in the case and charging the packing material into the case.

Figure 3:
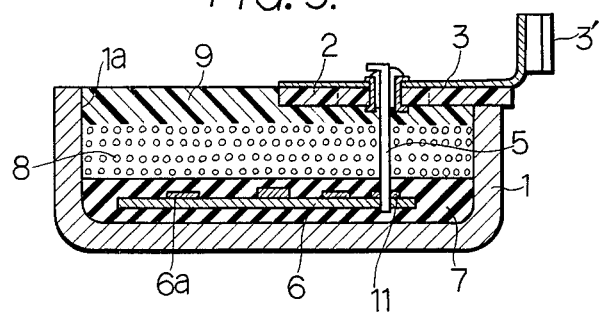
FIGS. 3 through 5 are sectional views of second, third and fourth embodiments according to the present invention.

FIG. 3 shows a second embodiment of the present invention, in which the printed-circuit board 6 with the electrical elements 6a fixed thereon is coated with the resilient material 7 such as silicon resin.

Figure 4:
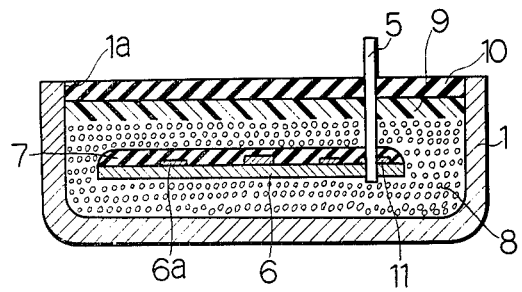

FIG. 4 shows a third embodiment of the present invention, in which the supporting plate 2 in FIG. 2 is eliminated, and a buffer layer 10 made of silicon rubber or the like is instead formed on the insulating resin layer 9 for preventing the lead wires 5 from being disconnected at the outside surface of the insulating resin layer 9.

Figure 5:
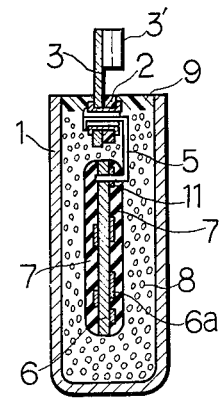
Figure 6:
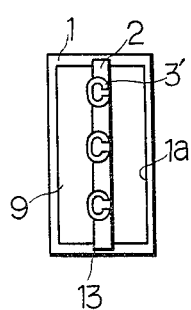
FIG. 6 is a top view of the electrical device in FIG. 5.

FIGS. 5 and 6 show a fourth embodiment of the present invention, in which the printed-circuit board 6 is disposed longitudinally in the case 1 and both sides of the board 6 are coated with the resilient material 7.

Figure 7:
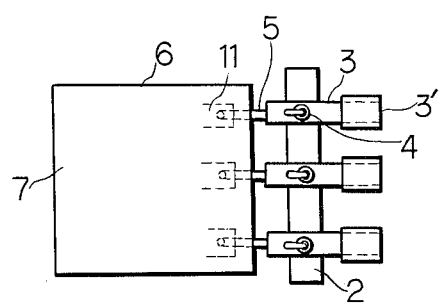
FIG. 7 is a plan view of the printed-circuit board used in the electrical device in FIG. 5, and FIGS. 8 and 9 are plan views of the modified printed-circuit board employed in the present invention.

In FIG. 7 showing the detailed construction of the printed-circuit board 6, numeral 11 is a printed copper foil on the board 6, and the supporting plate 2 is inserted into grooves 13 (shown in FIG. 6) provided on the inside of the opened end 1a. It would be much better when the supporting plate 2 is fixed to the case 1 by the insulating resin 9 while heating and hardening the insulating resin 9.

Figure 8:
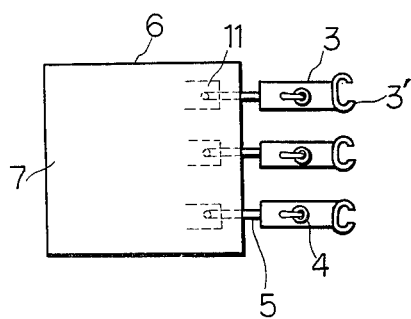

FIG. 8 shows a modification of the electrical device, in which the supporting plate 2 is eliminated, so that the terminal stays 3 are respectively fixed to and held in the case 1 by the insulating resin 9.

Figure 9:
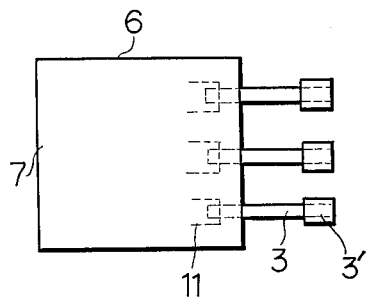

FIG. 9 shows a further modification of the electrical device, in which the lead wires 5 are eliminated, the terminal stays 3 are instead connected directly to the printed-circuit board 6 by soldering and they are likewise fixed to and held in the case 1 by the insulating resin 9.

It should be noted in the above embodiments that the printed-circuit board 6 is not necessarily coated entirely with the resilient material 7 but main part thereof can be coated.

Various tests have been made on IC voltage regulators with different granular insulating materials of low viscous resin filled therein as shown in Tables 1, 2 and 3.

Test (1): heating and cooling cycle test: Each sample was subjected to the following test cycle consisting of successive three conditions;

−50° C for one hour,
room temperature for five minutes,
and 150° C for one hour.

The test cycle was repeated ten times.

Test (2): Dampproof test: Each sample was subjected to the condition of humidity of more than 95% for 720 hours.

Test (3): Boiling water test: Each sample was subjected to the test cycle consisting of the following three conditions;
boiling water for five minutes,
water at normal temperature for 5 minutes, and
atmosphere for 30 minutes.

The above test was repeated ten times.

In the Tables, samples 1 through 20 and 41 through 45 are formed into the resin-sealed electrical devices shown in FIG. 2, samples 21 through 40 are formed into the devices shown in FIG. 4 wherein the buffer layer 10 is formed on the insulating resin layer 9, and the samples 46 through 60 are likewise formed into the devices shown in FIG. 2 wherein certain granular insulating material of certain percent in weight, which is shown in a column of "Constituent of low viscous resin" in Table 3, other than the granular insulating material 8 is respectively mixed into the low viscous resin 9 prior to pouring it into the case 1. The samples, into which the above granular insulating material is previously mixed at the ratio more than 20%, becomes worse in productivity as already explained in the "Description of Prior Art".

It is noted that productivity is enhanced especially when the packing material 8 is charged into the case 1 after the low viscous resin 9 is poured into the case 1 and heated at 60° ∼ 100° C to lower the viscosity of the resin 9.

However, the present invention is not limited to the above step, but can be accomplished by charging the packing material 8 into the case either after or before the low viscous resin 9 is poured into the case 1 irrespective of heating the resin 9.

Table 1

| Sample No. | Granular Insulating Material | Average grain size (μ) of Insulating Material | Constituent of low viscous resin | Results of Tests (1); (2) and (3) in aluminum case | Coating Material for printed-circuit board |
|---|---|---|---|---|---|
| 1 |  | 44 | Mixture A consisting of Resin: bisphenol type epoxy resin - 100PHR |  |  |
| 2 |  | 88 | Hardener: methyl highmic acid anihydride - 80PHR |  |  |
| 3 | SiO$_2$ | 250 | Catalyst: imidazole - 1PHR Diluent: polypropylene glycol - 80PHR |  |  |
| 4 |  | 840 |  |  | Silicon gel |
|  |  |  | Viscosity of Mixture A is 600 to 800 cps. |  | (KE104 Silicon gel made by |
| 5 |  | 4760 |  | well-operated | Sinetsu Chemical Co., Ltd.) |
| 6 |  | 44 | Mixture B consisting of Resin: bisphenol type epoxy resin - 100PHR |  |  |
| 7 |  | 88 | Hardener: Aliphatic amine of Epomate N-100- 50PHR |  |  |
| 8 | SiO$_2$ | 250 | (Epomate N-100 is a trade name of a product by Ajinomoto Co., Ltd.) Viscosity of Mixture B is 700 to 900 cps. |  |  |
| 9 |  | 840 |  |  |  |
| 10 |  | 4760 |  |  |  |
| 11 |  | 44 |  |  |  |
| 12 |  | 88 |  |  |  |
| 13 | Al$_2$O$_3$ | 250 | Mixture A |  |  |
| 14 |  | 840 |  |  |  |
| 15 |  | 4760 |  | well-operated | Silicon gel |
| 16 |  | 44 |  |  | (KE104) |
| 17 |  | 88 |  |  |  |

Table 1-continued

| Sample No. | Granular Insulating Material | Average grain size (μ) of Insulating Material | Constituent of low viscous resin | Results of Tests (1), (2) and (3) in aluminum case | Coating Material for printed-circuit board |
|---|---|---|---|---|---|
| 18 | Al₂O₃ | 250 | Mixture B | | |
| 19 | | 840 | | | |
| 20 | | 4760 | | | |

Table 2

| Sample No. | Granular Insulating Material | Average Grain size (μ) of Insulating Material | Constituent of low viscous resin | Results of Tests (1), (2) and (3) in aluminum case | Coating Material for Printed-circuit board |
|---|---|---|---|---|---|
| 21 | | 44 | | | |
| 22 | | 88 | | | |
| 23 | SiO₂ | 250 | Mixture A plus Silicon Rubber | | |
| 24 | | 840 | | | |
| 25 | | 4760 | | well-operated | Silicon gel (KE104) |
| 26 | | 44 | | | |
| 27 | | 88 | | | |
| 28 | SiO₂ | 250 | Mixture B plus Silicon rubber | | |
| 29 | | 840 | | | |
| 30 | | 4760 | | | |
| 31 | | 44 | Mixture C consisting of Resin: bisphenol type epoxy resin - 100PHR Hardener: aromatic amine of Epicure Z - 20PHR | | |
| 32 | | 88 | | | Silicon gel |
| 33 | Al₂O₃ | 250 | (Epicure Z is a trade name of a product by Shell Chemical Company.) | | (KE104) |
| 34 | | 840 | Viscosity of Mixture C is 8000 to 9000 cps. | | |
| 35 | | 4760 | | well-operated | |
| 36 | | 44 | | | |
| 37 | | 88 | Mixture C + Silicon rubber | | Silicon rubber (SH 9140 silicon rubber made by Toray Industries Inc.) |
| 38 | Al₂O₃ | 250 | | | |
| 39 | | 840 | | | |
| 40 | | 4760 | | | |

Table 3

| Sample No. | Granular Insulating Material | Average grain size (μ) of Insulating Material | Constituent of low viscous resin | Results of Tests (1), (2) and (3) in aluminum case | Coating Material for printed-circuit board |
|---|---|---|---|---|---|
| 41 | | 500 | Mixture A | | |
| 42 | | 500 | Mixture B | | |
| 43 | Shirasu Balloon | 500 | Mixture C | | Silicon gel (KE104) |
| 44 | | 500 | Mixture A + Silicon rubber | | |
| 45 | | 500 | Mixture B + Silicon rubber (QR 43117) | well-operated | |
| 46 | | 500 | Mixture A + CaCo₃ (10%) | | |
| 47 | | 500 | Mixture A + CaCo₃ (20%) | | |
| 48 | Shirasu Balloon | 500 | Mixture A + CaCo₃ (30%) | | Silicon rubber (SH 9410) |
| 49 | | 500 | Mixture B + SiO₂ (10%) | | |
| 50 | | 500 | Mixture B + SiO₂ (20%) | | |
| 51 | | 1000 | Mixture A | | |
| 52 | | 1000 | Mixture A + SiO₂ (40%) | | |
| 53 | Glass Beads | 1000 | Mixture A + SiO₂ (60%) | | Silicon gell (KE104) |
| 54 | | 1000 | Mixture B + SiO₂ (40%) | | |
| 55 | | 1000 | Mixture C + SiO₂ (40%) | well-operated | |
| 56 | | 1000 | Mixture A | | |
| 57 | | 1000 | Mixture A + SiO₂ (40%) | | |
| 58 | Glass Beads | 1000 | Mixture A + SiO₂ (60%) | | Silicon rubber (SH 9140) |
| 59 | | 1000 | Mixture B + SiO₂ (40%) | | |
| 60 | | 1000 | Mixture C + SiO₂ (40%) | | |

Tables 4, 5 and 6 show the results of the Tests (1), (2) and (3) which were made on the conventional resin-sealed electrical device in which coating by the resilient material 7 such as silicon resin is not carried on the printed-circuit board 6 and the electrical elements 6a.

Table 4

| Sample No. | Sealing Resin | Coating for Printed-circuit board | Results of Tests (1), (2) and (3) |
|---|---|---|---|
| 71 | Mixture A + SiO₂ (40%) | No | failed |

Table 4-continued

| Sample No. | Sealing Resin | Coating for Printed-circuit board | Results of Tests (1), (2) and (3) |
|---|---|---|---|
| 72 | Mixture A + CaCo$_3$ (70%) | No | failed |
| 73 | Mixture B + SiO$_2$ (60%) | No | failed |

Table 5

| Sample No. | Sealing Resin | Coating for Printed-circuit board | Results of Tests (1), (2) and (3) |
|---|---|---|---|
| 74 | Silicon rubber | No | failed |
| 75 | Urethane | No | failed |
| 76 | Poly-Btadiene | No | failed |

Table 6

| Sample No. | Sealing Resin | Coating for Printed-circuit board | Results of Tests (1), (2) and (3) |
|---|---|---|---|
| 77 | Epoxy resin No. 280*[1] | No | failed |
| 78 | Epoxy resin No. K-521*[2] | No | failed |
| 79 | Epoxy resin KE-521*[3] | No | failed |

*[1]No. 280 is a trade name of epoxy resin made by Sumitomo 3M Limited.
*[2]No. K-521 is a trade name of epoxy resin made by Somar Manufacturing Co., Ltd..
*[3]KE-531 is a trade name of epoxy resin made by Hitachi Chemical Co., Ltd..

It should be noted that the conventional electrical device is less resistive against the severe environmental changes, such as heating and cooling cycles, vibrations, humidity and the like in comparison with that of the present invention.

According to the present invention, the following conclusions can be made.
(1) The electrical device becomes much resistive against the heating and cooling cycles and other environmental changes depending on the facts that
   (a) the coefficient of thermal expansion of the sealing material (comprising the low viscous resin and the packing material) can be minimized,
   (b) a large amount of the packing material (almost up to 75~95%) can be charged into the case, and
   (c) Coating by the resilient material is carried on the printed-circuit board and the electrical elements.
(2) The electrical device can be produced with higher productivity depending on the fact that the packing material and the low viscous resin are charged into the case independently, so that the viscosity of the sealing material may not be increased.
(3) The electrical device can be produced with much higher productivity when the packing material is charged into the case after the low viscous resin is poured thereinto depending on the fact that no bubbles are produced in the sealing material.
(4) The electrical device becomes especially much resistive against vibration when the buffer layer is formed at the upper portion of the sealing material and so on.

What is claimed is:
1. A resin-sealed electrical device comprising:
a case;
an electrical element disposed in said case;
a coating of resilient and insulating material on said electrical element; and
means, disposed in said case, for sealing and insulating said electrical element, said means comprising a first layer of minute granular insulating material located around said electrical element and said coating and a second layer of low viscous insulating resin formed on said first layer, the density of said minute granular insulating material being larger than that of said low viscous insulating resin so that said minute granular insulating material can impregnate into said low viscous insulating resin when said minute granular insulating material is charged onto said low viscous insulating resin, thereby to replace the positions of said minute granular insulating material and low viscous insulating resin to make said first and second layers, and further said first layer being composed of said minute granular insulating material and said low viscous insulating resin because of the impregnation of the former into the latter.

2. A resin-sealed electrical device as set forth in claim 1, wherein the grain size of said fine granular insulating material is between 44μ and 4760μ.

3. A resin-sealed electrical device as set forth in claim 1, wherein said minute granular insulating material is one of the materials selected from the group consisting of SiO$_2$, Al$_2$O$_3$, Shirasu baloon and glass beads.

4. A resin-sealed electrical device as set forth in claim 1 further comprising a buffer layer formed on said sealing and insulating means.

5. A resin-sealed electrical device as set forth in claim 1 further comprising;
a supporting plate fixed to said case;
an electrical terminal supported on aid supporting plate; and
a lead wire disposed in said sealing and insulating means for connecting said electrical element and said electrical terminal.

6. A resin-sealed electrical device as set forth in claim 4 further comprising;
a lead wire, one end thereof passing through said buffer layer and disposed in said sealing and insulating means for electrical connection with said electrical element; and
an electrical terminal respectively connected with the other end of said lead wire.

7. A resin-sealed electrical device as set forth in claim 1 further comprising an electrical terminal, one end thereof being disposed in said sealing and insulating means for electrical connection with said electrical element, and the other end thereof protruding from said sealing and insulating means.

8. A resin-sealed electrical device as set forth in claim 1 further comprising a printed-circuit board on which said electrical element is fixed.

9. A method for manufacturing a resin-sealed electrical device as set forth in claim 8, wherein the grain size of said granular material is between 44μ and 4760μ.

10. A method for manufacturing a resin-sealed electrical device comprising the steps of;
disposing electrical elements in a case;
pouring a low viscous fluid resin into said case;
charging a minute granular insulating material the density of which is greater than said low viscous resin into said case separately to fill said case to a predetermined level after said pouring step; and
heating and hardening said low viscous resin, to thereby complete a resin-sealed electrical device.

11. A method as set forth in claim 10 further comprising the step of heating said low viscous resin prior to the step of charging said minute granular insulating material to lower the viscosity of said resin so that said minute granular insulating material can impregnate said low viscous fluid resin.

12. A resin-sealed electrical device comprising:
- a case;
- a plurality of electrical elements disposed in said case;
- a coating of resilient and insulating material on said electrical elements; and
- insulation sealing means filling said case, said sealing means being comprised of a low viscous resin, and minute granules of low thermal expansion coefficient, the density of which is greater than that of said low viscous resin, said viscous resin filling the interstices between said granules and binding said granules, said low viscous resin and said granules being added separately so that a layer of resin is formed atop said granules.

* * * * *